US012160230B2

(12) United States Patent
Nosaka et al.

(10) Patent No.: US 12,160,230 B2
(45) Date of Patent: Dec. 3, 2024

(54) SWITCHING CIRCUIT APPARATUS CAPABLE OF CONTROLLING MULTIPLE SWITCHING ELEMENTS TO SYNCHRONOUSLY TURN ON AND OFF WITH BOOTSTRAP CIRCUIT

(71) Applicant: OMRON Corporation, Kyoto (JP)

(72) Inventors: Noriyuki Nosaka, Kyoto (JP); Junya Mishima, Kyoto (JP); Mamoru Sueki, Kyoto (JP); Wataru Okada, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 18/022,562

(22) PCT Filed: Aug. 31, 2021

(86) PCT No.: PCT/JP2021/031991
§ 371 (c)(1),
(2) Date: Feb. 22, 2023

(87) PCT Pub. No.: WO2022/050280
PCT Pub. Date: Mar. 10, 2022

(65) Prior Publication Data

US 2023/0327664 A1   Oct. 12, 2023

(30) Foreign Application Priority Data

Sep. 1, 2020 (JP) ................. 2020-147014

(51) Int. Cl.
*H03K 17/687* (2006.01)
*H02M 1/00* (2006.01)
(Continued)

(52) U.S. Cl.
CPC ........ *H03K 17/687* (2013.01); *H02M 1/0006* (2021.05); *H02M 3/156* (2013.01); *H03K 19/01714* (2013.01)

(58) Field of Classification Search
CPC ........... H03K 17/687; H03K 19/01714; H03K 17/08142; H03K 17/102; H03K 17/063;
(Continued)

(56) References Cited

U.S. PATENT DOCUMENTS

| 9,705,423 B1 | 7/2017 | Micic |
| 2007/0183174 A1* | 8/2007 | Lee .................... H03K 17/6871 363/111 |
| 2014/0043009 A1 | 2/2014 | Sakai |

FOREIGN PATENT DOCUMENTS

| CN | 106714032 B | 2/2020 |
| JP | 2007123706 A | 5/2007 |

(Continued)

OTHER PUBLICATIONS

International Search Report for International Application No. PCT/JP2021/031991; Date of Mailing, Nov. 2, 2021.
(Continued)

*Primary Examiner* — Jung Kim (74) *Attorney, Agent, or Firm* — CANTOR COLBURN LLP (57) ABSTRACT

In a switching circuit apparatus, first and second capacitors apply power supply voltages to first and second drive circuits. First and second diodes are connected such that currents flow from a DC voltage source to the first and second capacitors. A resistor and a Zener diode are connected in series between a terminal and a node, such that a reverse bias voltage is applied from the terminal to the Zener diode via the resistor. A third diode is connected such that a current flows to the first capacitor from a node (N2) between the resistor and the Zener diode.

6 Claims, 9 Drawing Sheets

(51) Int. Cl.
*H02M 3/156* (2006.01)
*H03K 19/017* (2006.01)

(58) Field of Classification Search
CPC .... H03K 2217/0081; H03K 19/01735; H02M 1/0006; H02M 3/156; H02M 1/08
See application file for complete search history.

(56) References Cited

FOREIGN PATENT DOCUMENTS

| | | |
|---|---|---|
| JP | 2014036489 A | 2/2014 |
| JP | 6141546 B1 | 6/2017 |
| WO | 2011096175 A1 | 8/2011 |

OTHER PUBLICATIONS

PCT Written Opinion of the International Searching Authority for International Application No. PCT/JP2021/031991; Mailing Date, Nov. 2, 2021.
Alvis Sokolovs et al: "Analysis of Gate Drivers for OvervoltageSuppression in Matrix Converters fort Integrated Drives" Scientific Journal of Riga Technical University. Power and Electrical Engineering, Jan. 1, 2009.
Balogh L: "Design and application guide for high speed MOSFET gate drive circuits" Internet Citation, Jan. 1, 2001.
EPO Extended European Search Report for corresponding EP Application No. 21864337.7I Issued Sep. 6, 2024.
Laszlo Balogh: "Fundamentals of MOSFET and IGBT Gate Driver Circuits, Application Report SLUA618A", Oct. 15, 2018.

* cited by examiner

SWITCHING CIRCUIT APPARATUS CAPABLE OF CONTROLLING MULTIPLE SWITCHING ELEMENTS TO SYNCHRONOUSLY TURN ON AND OFF WITH BOOTSTRAP CIRCUIT

CROSS REFERENCE TO RELATED APPLICATIONS

This is the U.S. national stage of application No. PCT/JP2021/031991, filed on Aug. 31, 2021. Priority under 35 U.S.C. § 119(a) and 35 U.S.C. § 365(b) is claimed from Japanese Application No. 2020-147014, filed Sep. 1, 2020, the disclosure of which is also incorporated herein by reference.

TECHNICAL FIELD

The present disclosure relates to a switching circuit apparatus provided with a bootstrap circuit. The present disclosure also relates to a power converter apparatus provided with at least one such switching circuit apparatus.

BACKGROUND ART

A switching power supply apparatus may be provided with a bootstrap circuit including a capacitor, in order to apply drive signals having a sufficiently high voltage to control terminals of switching elements (for example, gates of transistors).

For example, Patent Document 1 discloses a power converter device provided with a bootstrap circuit. The power converter device of Patent Document 1 is provided with a series circuit in which one end is connected to a positive electrode of a first DC power supply, and the other end is connected to a negative electrode of the first DC power supply, and in which a first switching element, a second switching element, and a shunt resistor are connected in series in this order. The power converter device is provided with an output unit connected between the first switching element and the second switching element. The power converter device is provided with a first drive circuit for turning the first switching element on and off, and a second drive circuit for turning the second switching element on and off complementarily to the first switching element. The power converter device is provided with a second DC power supply as a power supply for the second drive circuit, and a capacitor as a power supply for the first drive circuit, the capacitor being to be charged by the second DC power supply when the second switching element is turned on. The power converter device is provided with a controller for detecting anomaly of the bootstrap circuit including a capacitor before start-up, using a current flowing through the shunt resistor during initial charging of the capacitor.

CITATION LIST

Patent Documents

PATENT DOCUMENT 1: Japanese Patent JP 6141546 B

SUMMARY OF INVENTION

Technical Problem

In order to provide a switching power supply apparatus operable at a high voltage, a plurality of identical circuit elements may be connected in series to relax requirements for circuit elements, such as switching elements, for example, withstand voltage performance.

However, in the case of the switching power supply apparatus provided with the bootstrap circuit, when synchronously turning on and off two series-connected switching elements, it is not possible to keep a sufficiently high voltage to operate the drive circuit in the capacitor of the bootstrap circuit. As a result, the two switching elements cannot be simultaneously turned on, and one of the switching elements may be broken due to overvoltage. Therefore, it is required to control the plurality of switching elements to synchronously turn on and off with the bootstrap circuit.

An object of the present disclosure is to provide a switching circuit apparatus capable of controlling a plurality of switching elements to synchronously turn on and off with a bootstrap circuit. Another object of the present disclosure is to provide a power converter apparatus provided with at least one such switching circuit apparatus.

Solution to Problem

According to an aspect of the present disclosure, a switching circuit apparatus connected to first and second DC voltage sources is provided. The switching circuit apparatus is provided with a first terminal, a second terminal, first and second switching elements, first and second drive circuits, a first capacitor, a second capacitor, a first diode, a second diode, a first series circuit, and a third diode. The first terminal is applied with a first voltage from the first DC voltage source. The second terminal is applied with a second voltage lower than the first voltage from the first DC voltage source. The first and second switching elements are connected in series between the first and second terminals, the first and second switching elements being connected via a first node. The first and second drive circuits control the first and second switching elements, respectively, to synchronously turn on and off. The first capacitor is connected to the first node, the first capacitor applying a power supply voltage for the first drive circuit to the first drive circuit. The second capacitor is connected to a negative electrode of the second DC voltage source and to the second terminal, the second capacitor applying a power supply voltage for the second drive circuit to the second drive circuit. The first diode is connected between a positive electrode of the second DC voltage source and the first capacitor such that a current flows from the second DC voltage source to the first capacitor. The second diode is connected between the positive electrode of the second DC voltage source and the second capacitor such that a current flows from the second DC voltage source to the second capacitor. The first series circuit includes a first resistor and a first Zener diode connected in series between the first terminal and the first node, the first resistor and the first Zener diode being connected via a second node, the first resistor and the first Zener diode being connected in parallel with the first switching element, the first series circuit being connected such that a reverse bias voltage is applied from the first terminal to the first Zener diode via the first resistor. The third diode is connected between the second node and the first capacitor such that a current flows from the second node to the first capacitor.

With such a configuration, it is possible to control the plurality of switching elements to synchronously turn on and off with the bootstrap circuit.

According to an aspect of the present disclosure, the switching circuit apparatus is further provided with: a second series circuit and a fourth diode. The second series circuit includes a second resistor and a second Zener diode connected in series between the first node and the second terminal, the second resistor and the second Zener diode being connected via a third node, the second resistor and the second Zener diode being connected in parallel with the second switching element, the second series circuit being connected such that a reverse bias voltage is applied from the first node to the second Zener diode via the second resistor. The fourth diode is connected between the third node and the second capacitor such that a current flows from the third node to the second capacitor.

With such a configuration, it is possible to charge the second capacitor from the first terminal through the second resistor and the fourth diode, when the first and second switching elements are turned off.

According to an aspect of the present disclosure, the switching circuit apparatus is further provided with: a third resistor connected between the first drive circuit and the first switching element; and a fourth resistor connected between the second drive circuit and the second switching element.

With such a configuration, it is possible to appropriately limit gate currents of the first and second switching elements.

According to an aspect of the present disclosure, the switching circuit apparatus is further provided with: a fifth resistor connected between the positive electrode of the second DC voltage source and the first capacitor, the fifth resistor being connected in series with the first diode.

With such a configuration, it is possible to appropriately limit a current flowing from the DC voltage source to the first capacitor.

According to an aspect of the present disclosure, the switching circuit apparatus is further provided with: third and fourth Zener diodes connected in parallel with the first and second capacitors, respectively.

With such a configuration, it is possible to stabilize the power supply voltages for the first and second drive circuits.

According to an aspect of the present disclosure, a power converter apparatus is provided with: at least one switching circuit apparatus as described above; and a control circuit configured to control the at least one switching circuit apparatus.

With such a configuration, it is possible to provide a power converter apparatus having higher withstand voltage performance than that of the prior art, or a power converter apparatus having higher efficiency and lower cost than those of the prior art.

Advantageous Effects of Invention

According to the switching circuit apparatus of one aspect of the present disclosure, it is possible to control the plurality of switching elements to synchronously turn on and off with the bootstrap circuit.

DESCRIPTION OF EMBODIMENTS

Hereinafter, embodiments according to one aspect of the present disclosure will be described with reference to the drawings. In the drawings, the same reference numerals denote similar components.

Application Example

Figure 1:
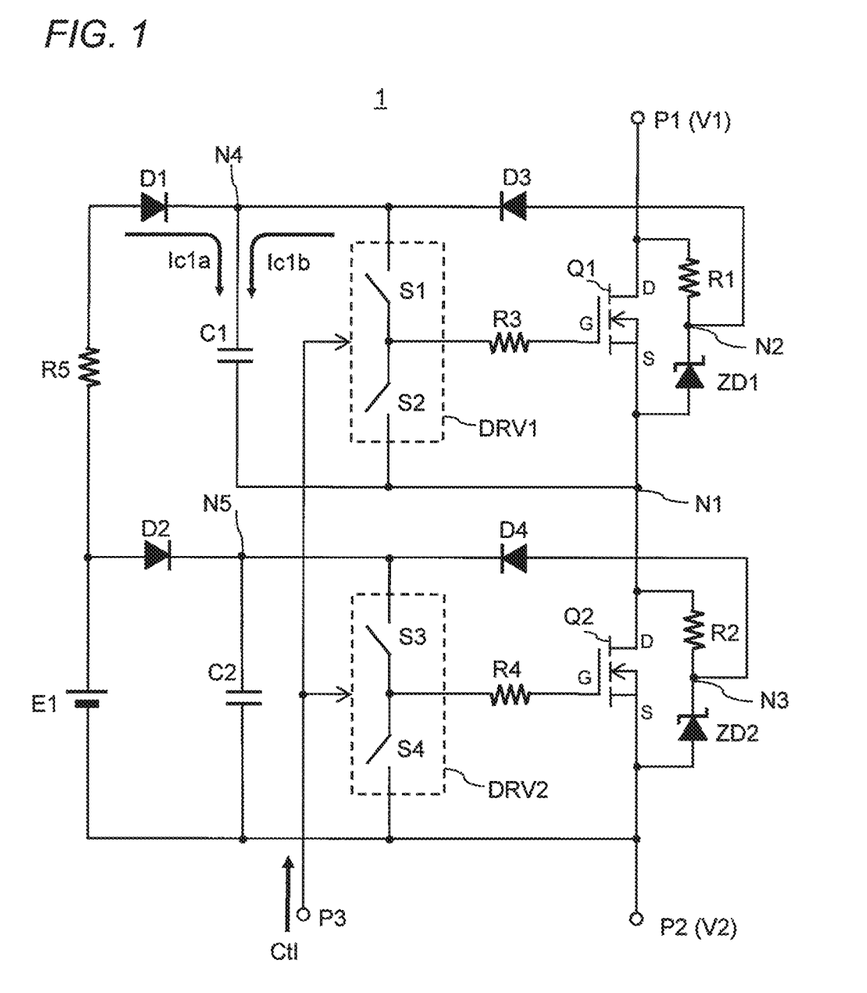
FIG. 1 is a circuit diagram showing an exemplary configuration of a switching circuit apparatus 1 according to a first embodiment.

FIG. 1 is a circuit diagram showing an exemplary configuration of a switching circuit apparatus 1 according to a first embodiment. The switching circuit apparatus 1 according to the present embodiment is provided with: at least a first terminal P1, a second terminal P2, a first switching element Q1, a second switching element Q2, a first drive circuit DRV1, a second drive circuit DRV2, a first capacitor C1, a second capacitor C2, a first diode D1, a second diode D2, a first resistor R1, a first Zener diode ZD1, and a third diode D3.

The switching circuit apparatus 1 is connected to an external first DC voltage source (for example, a DC voltage source 101 of FIGS. 7 to 9), and connected to an internal or external second DC voltage source E1, and the switching circuit apparatus 1 is supplied with certain voltages.

The terminal P1 is applied with a first voltage V1 from the first DC voltage source. The terminal P2 is applied with a second voltage V2 lower than the first voltage V1 from the first DC voltage source.

The switching elements Q1 and Q2 are connected in series between the terminals P1 and P2, the switching elements Q1 and Q2 being connected via a node N1. The drive circuits DRV1 and DRV2 control the switching elements Q1 and Q2 to synchronously turn on and off The capacitor C1 is connected to the node N1 and applies a power supply voltage for the drive circuit DRV1 to the drive circuit DRV1. The capacitor C2 is connected to a negative electrode of the DC voltage source E1 and the terminal P2 and applies a power supply voltage for the drive circuit DRV2 to the drive circuit DRV2.

The diode D1 is connected between a positive electrode of the DC voltage source E1 and the capacitor C1 such that a current flows from the DC voltage source E1 to the capacitor C1. The diode D2 is connected between the positive electrode of the DC voltage source E1 and the capacitor C2 such that a current flows from the DC voltage source E1 to the capacitor C2.

The capacitor C1 and the diode D1 constitute a bootstrap circuit.

The resistor R1 and the Zener diode ZD1 constitute a series circuit connected in series between the terminal P1 and the node N1, the resistor R1 and the Zener diode ZD1 being connected via a node N2, the resistor R1 and the Zener diode ZD1 being connected in parallel with the switching element Q1. In addition, the resistor R1 and the Zener diode ZD1 are connected such that a reverse bias voltage is applied from the terminal P1 to the Zener diode ZD1 via the resistor R1.

The diode D3 is connected between the node N2 and the capacitor C1 such that a current flows from the node N2 to the capacitor C1.

According to a conventional switching power supply apparatus provided with a bootstrap circuit (for example, see Patent Document 1), two series-connected switching elements operate complementarily. The capacitor of the bootstrap circuit is charged in a time interval in which the high-side switching element is turned off and the low-side switching element is turned on. Therefore, before turning on the high-side switching element, the capacitor of the bootstrap circuit is charged to a sufficiently high voltage to operate the drive circuit of the high-side switching element. In such a conventional switching power supply apparatus, when two switching elements are synchronously turned on and off, the capacitor of the bootstrap circuit cannot be charged when the two switching elements are turned off. Therefore, the voltage of the capacitor of the bootstrap circuit cannot be sufficiently increased before turning on the high-side switching element.

On the other hand, since the switching circuit apparatus 1 according to the present embodiment is provided with the resistor R1, the Zener diode ZD1, and the diode D3, a current flows from the terminal P1 to the capacitor C1 via the resistor R1 and the diode D3 when the switching elements Q1 and Q2 are turned off. Therefore, before turning on the switching elements Q1 and Q2, it is possible to sufficiently increase the voltage of the capacitor C1 to operate the drive circuit DRV1. As a result, it is possible to simultaneously turn on the switching elements Q1 and Q2 without delay, and an excessive voltage is less likely to be applied to only one of the switching elements. Thus, the switching circuit apparatus 1 according to the present embodiment can control the switching elements Q1 and Q2 to synchronously turn on and off with the bootstrap circuit.

First Embodiment

Hereinafter, the switching circuit apparatus according to the first embodiment will be further described.

Configuration Example of First Embodiment

The switching circuit apparatus 1 has nodes N1 to N5 as shown in FIG. 1.

The switching elements Q1 and Q2 are, for example, N-channel MOSFETs.

The drive circuit DRV1 is provided with, for example, switching elements S1 and S2 connected in series between the nodes N4 and N1. The switching elements S1 and S2 are complementarily turned on and off, so that the drive circuit DRV1 outputs the voltage potential of the node N4 or the voltage potential of the node N1, as a drive signal for the switching element Q1. When the drive signal is high, the switching element Q1 is turned on, and when the drive signal is low, the switching element Q1 is turned off.

The drive circuit DRV2 is provided with, for example, switching elements S3 and S4 connected in series between the node N5 and the terminal P2. The switching elements S3 and S4 are complementarily turned on and off, so that the drive circuit DRV2 outputs the voltage potential of the node N5 or the voltage potential of the terminal P2, as a drive signal for the switching element Q2. When the drive signal is high, the switching element Q2 is turned on, and when the drive signal is low, the switching element Q2 is turned off.

The drive circuits DRV1 and DRV2 control the switching elements Q1 and Q2, respectively, to synchronously turn on and off, according to a control signal Ctl inputted from an external control circuit (for example, a control circuit 103 in FIGS. 7 and 10, a control circuit 103A of FIG. 8, or a control circuit 103B of FIG. 9) via a terminal P3.

The diodes D1 and D3 prevent a backflow current from the capacitor C1 to circuit elements other than the drive circuit DRV1.

The Zener diode ZD1 appropriately limits the voltage applied to the capacitor C1 (that is, the power supply voltage for the drive circuit DRV1) when the switching element Q1 is turned off. In addition, the resistor R1 appropriately limits the current flowing from the terminal P1 to the capacitor C1 when the switching element Q1 is turned off.

The switching circuit apparatus 1 of FIG. 1 may be further provided with a diode D4, resistors R2 to R5, and a Zener diode ZD2.

The resistor R2 and the Zener diode ZD2 constitute a series circuit connected in series between the node N1 and the terminal P2, the resistor R2 and the Zener diode ZD2 being connected via the node N3, the resistor R2 and the Zener diode ZD2 being connected in parallel with the switching element Q2. The resistor R2 and the Zener diode ZD2 are connected such that a reverse bias voltage is applied from the node N1 to the Zener diode ZD2 via the resistor R2.

The diode D4 is connected between the node N3 and the capacitor C2 such that a current flows from the node N3 to the capacitor C2.

The diodes D2 and D4 prevent a backflow current from the capacitor C2 to circuit elements other than the drive circuit DRV2.

The Zener diode ZD2 appropriately limits the voltage applied to the capacitor C2 (that is, the power supply voltage for the drive circuit DRV2) when the switching element Q2 is turned off. In addition, the resistor R2 appropriately limits the current flowing from the node N1 to the capacitor C2 when the switching element Q2 is turned off.

The resistor R3 is connected between the output terminal of the drive circuit DRV1 (node between the switching elements S1 and S2) and the gate of the switching element Q1. The resistor R3 appropriately limits the gate current of the switching element Q1 according to a desired operation speed of the switching element Q1. The resistor R4 is connected between the output terminal of the drive circuit DRV2 (node between the switching elements S3 and S4) and the gate of the switching element Q2. The resistor R4 appropriately limits the gate current of the switching element Q2 according to a desired operation speed of the switching element Q2.

The resistor R5 is connected between the positive electrode of the DC voltage source E1 and the capacitor C1, the resistor R5 being connected in series to the diode D1. The resistor R5 appropriately limits the current flowing from the DC voltage source E1 to the capacitor C1.

Operation Example of First Embodiment

At first, operations of switching circuit apparatuses according to comparison examples will be described.

Figure 2:
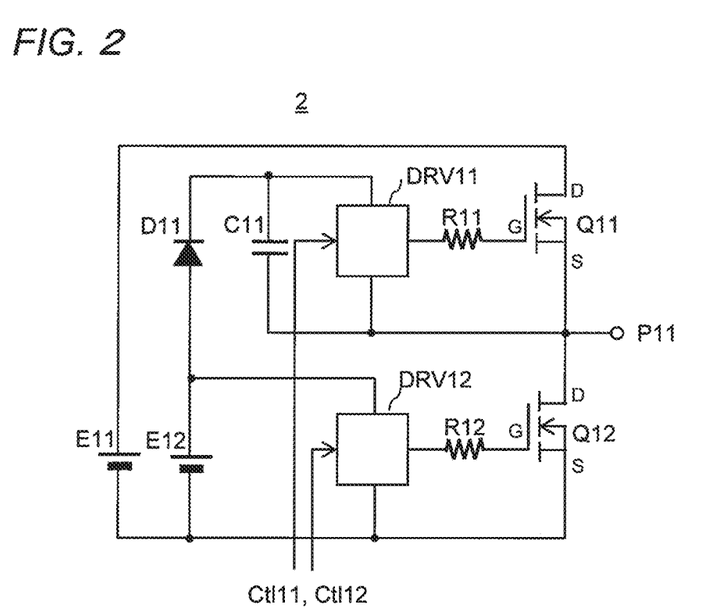
FIG. 2 is a circuit diagram showing a configuration of a switching circuit apparatus 2 according to a first comparison example.

FIG. 2 is a circuit diagram showing a configuration of a switching circuit apparatus 2 according to a first comparison example. The switching circuit apparatus 2 is provided with: switching elements Q11 and Q12, resistors R11 and R12, drive circuits DRV11 and DRV12, a capacitor C11, a diode D11, DC power supplies E11 and E12, and a terminal P11.

The switching elements Q11 and Q12 are connected in series between a positive electrode and a negative electrode of the DC power supply E11. The drive circuits DRV11 and DRV12 are connected to the switching elements Q11 and Q12 via the resistors R11 and R12, respectively. The drive circuit DRV11 controls the switching element Q11 to turn on and off in accordance with a control signal Ctl11. The drive circuit DRV12 controls the switching element Q12 to turn on and off complementarily to the switching element Q11 according to a control signal Ctl 12. The DC power supply E12 is a power supply for the drive circuit DRV12.

The capacitor C11 is a power supply for the drive circuit DRV11 and is charged by the DC power supply E12 via the diode D1 when the switching element Q12 is turned on. The output voltage of the switching circuit apparatus 2 is generated at the terminal P11 connected to the node between the switching elements Q11 and Q12.

The switching circuit apparatus 2 of FIG. 2 has the same configuration as that of the power converter apparatus of Patent Document 1.

According to the switching circuit apparatus 2, the switching elements Q11 and Q12 operate complementarily. When the switching element Q11 is turned off and the switching element Q12 is turned on, a current flows in the order of: a positive electrode of the DC power supply E12→the diode D1→the capacitor→the switching element Q12→a negative electrode of the DC power supply E12, and thus, the capacitor C11 is charged. Therefore, before turning on the switching element Q11, the capacitor C11 keeps a sufficiently high voltage to operate the drive circuit DRV11.

Figure 3:
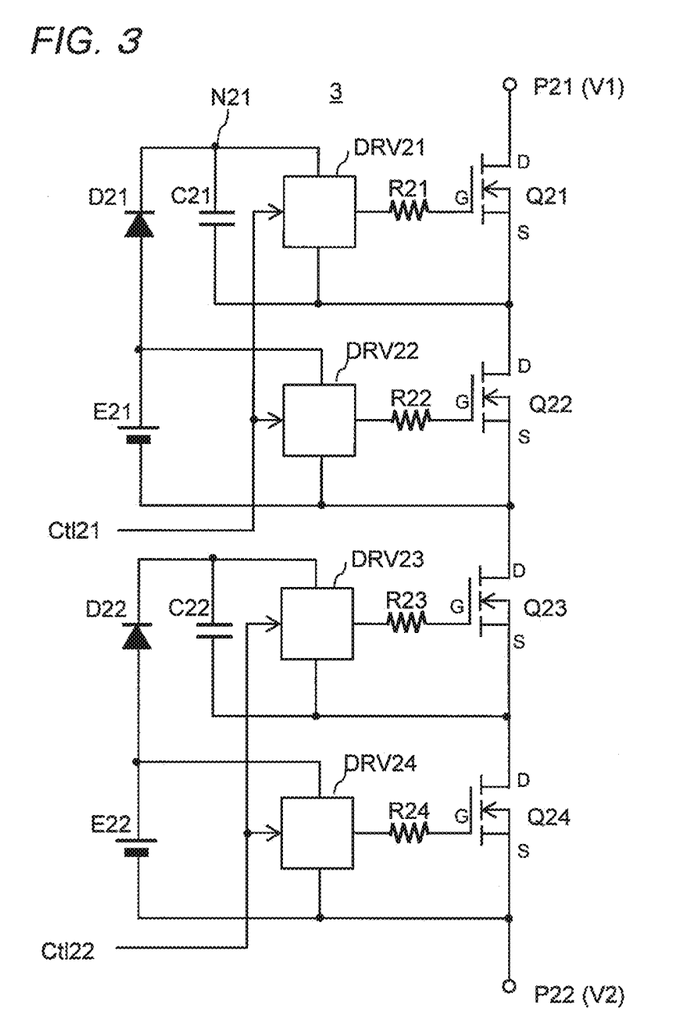
FIG. 3 is a circuit diagram showing a configuration of a switching circuit apparatus 3 according to a second comparison example.

FIG. 3 is a circuit diagram showing a configuration of a switching circuit apparatus 3 according to a second comparison example. The switching circuit apparatus 3 is provided with: switching elements Q21 to Q24, resistors R21 to R24, drive circuits DRV21 to DRV24, capacitors C21 and C22, diodes D21 and D22, DC power supplies E21 and E22, and terminals P21 and P22.

The terminal P21 is applied with a first voltage V1. The terminal P22 is applied with a second voltage V2 lower than the first voltage V1.

The switching elements Q21 to Q24 are connected in series between the terminals P21 and P22.

The drive circuits DRV21 and DRV22 are connected to the switching elements Q21 and Q22 via the resistors R21 and R22, respectively. The drive circuits DRV21 and DRV22 control the switching elements Q21 and Q22, respectively, to synchronously turn on and off according to a control signal Ctl21. The drive circuits DRV23 and DRV24 are connected to the switching elements Q23 and Q24 via the resistors R23 and R24, respectively. The drive circuits DRV23 and DRV24 control the switching elements Q23 and Q24, respectively, to synchronously turn on and off according to a control signal Ctl22.

The DC power supply E21 is a power supply for the drive circuit DRV22. The capacitor C21 is a power supply for the drive circuit DRV21 and is charged by the DC power supply E21 via the diode D21 when the switching element Q22 is turned on. The DC power supply E22 is a power supply for the drive circuit DRV24. The capacitor C22 is a power supply for the drive circuit DRV23 and is charged by the DC power supply E22 via the diode D22 when the switching element Q24 is turned on.

The switching elements Q21 and Q22, the resistors R21 and R22, the drive circuits DRV21 and DRV22, the capacitor C21, the diode D21, and the DC power supply E21 of FIG. 3 are configured in a manner similar to that of the circuit of FIG. 2, except that the drive circuits DRV21 and DRV22 control the switching elements Q21 and Q22 to synchronously turn on and off. In addition, the switching elements Q23 and Q24, the resistors R23 and R24, the drive circuits DRV23 and DRV24, the capacitor C22, the diode D22, and the DC power supply E22 of FIG. 3 are configured in a manner similar to that of the circuit of FIG. 2, except that the drive circuits DRV23 and DRV24 control the switching elements Q23 and Q24 to synchronously turn on and off. By controlling the series-connected switching elements Q21 to Q24 to synchronously turn on and off, it is expected that requirements for the switching elements Q21 to Q24, such as withstand voltage performance, can be relaxed.

Figure 4:
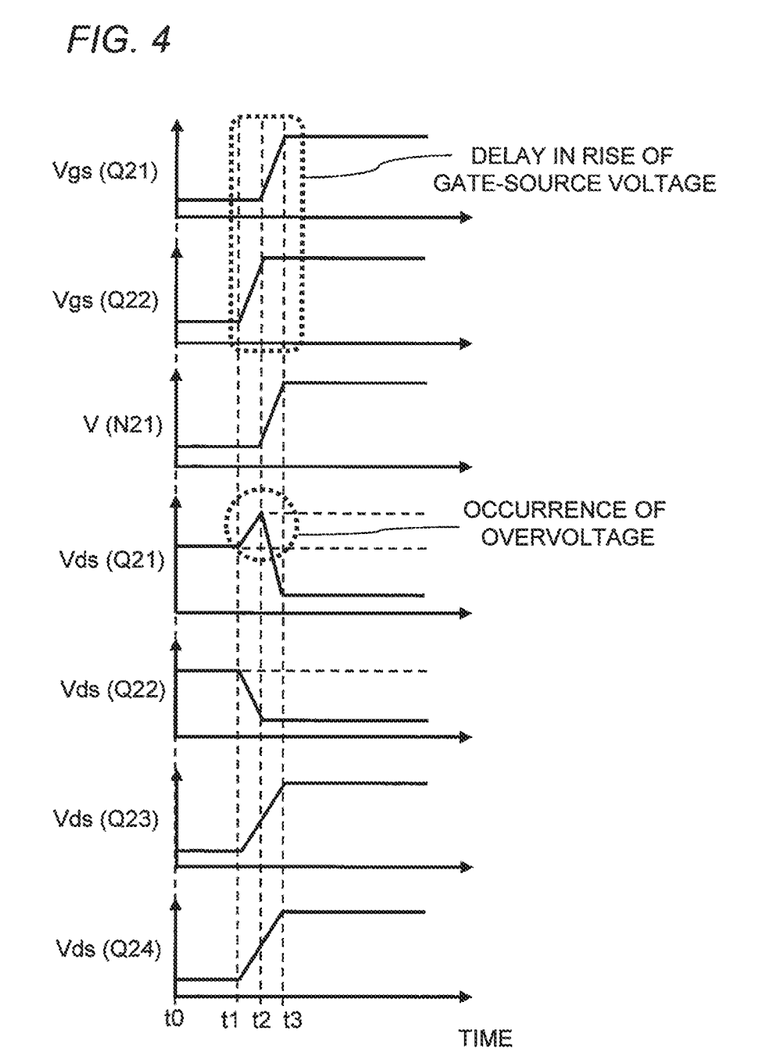
FIG. 4 is a timing chart showing exemplary operation of the switching circuit apparatus 3 of FIG. 3.

FIG. 4 is a timing chart showing exemplary operation of the switching circuit apparatus 3 of FIG. 3. Respective rows of FIG. 4 show gate-source voltages Vgs(Q21) and Vgs(Q22) of the switching elements Q21 and Q22, a voltage V(N21) at the node N21 of FIG. 3 and drain-source voltages Vds(Q21) to Vds(Q24) of the switching elements Q21 to Q24. In the example of FIG. 4, it is considered that when all the switching elements Q21 to Q24 are turned off, only the switching elements Q21 and Q22 transition from off to on.

In the time interval t0 to t1, when the switching element Q22 is turned off, the capacitor C21 cannot be charged, and the voltage V(N21) at the node N21 is low.

At the time moment t1, the control signal Ctl21 for transitioning the switching elements Q21 and Q22 from off to on is inputted to the drive circuits DRV21 and DRV22. However, since the voltage of the capacitor C21 is insufficient, at the time moment t1, only the gate-source voltage Vgs(Q22) of the switching element Q22 rises, and the gate-source voltage Vgs(Q21) of the switching element Q21 remains low.

At the time moment t2, when the gate-source voltage Vgs(Q21) of the switching element Q22 reaches high, the switching element Q22 is turned on. When the switching element Q22 is turned on, charging of the capacitor C21 starts, the voltage V(N21) at the node N21 starts increasing, and the gate-source voltage Vgs(Q21) of the switching element Q21 also starts increasing.

At the time moment t3, when the voltage V(N21) at the node N21 and the gate-source voltage Vgs(Q21) of the switching element Q21 reach high, the switching element Q21 is turned on.

As shown in FIG. 4, since the rise of the gate-source voltage Vgs(Q21) is delayed from the rise of the gate-source voltage Vgs(Q22), only the switching element Q22 is firstly turned on, while the switching element Q21 remains off. As a result, an excessive voltage may be applied across the drain and source of the switching element Q21, and the switching element Q21 may be broken.

When the switching element Q22 is turned off, the charging of the capacitor C21 stops, and the voltage V(N21) at the node N21 gradually decreases.

On the other hand, since the switching circuit apparatus 1 of FIG. 1 is provided with the resistor R1, the Zener diode ZD1, and the diode D3, a current flows from the terminal P1 to the capacitor C1 via the resistor R1 and the diode D1 when the switching elements Q1 and Q2 are turned off. Specifically, when the switching elements Q1 and Q2 are turned off, currents flow through the capacitors C1 and C2 along the following paths.

(a) Positive electrode of DC voltage source E1→resistor R5→diode D1→capacitor C1→resistor R2→diode D4→capacitor C2→negative electrode of DC voltage source E1

(b) Positive electrode of DC voltage source E1→diode D2→capacitor C2→negative electrode of DC voltage source E1
(c) Terminal P1→resistor R1→diode D3→capacitor C1→resistor R2→diode D4→capacitor C2→terminal P2

When the switching elements Q1 and Q2 are turned on, currents flow through the capacitors C1 and C2 along the following paths.
(d) Positive electrode of DC voltage source E1→resistor R5→diode D1→capacitor C1→switching element Q2→negative electrode of DC voltage source E1
(e) Positive electrode of DC voltage source E1→diode D2→capacitor C2→negative electrode of DC voltage source E1

Figure 5:
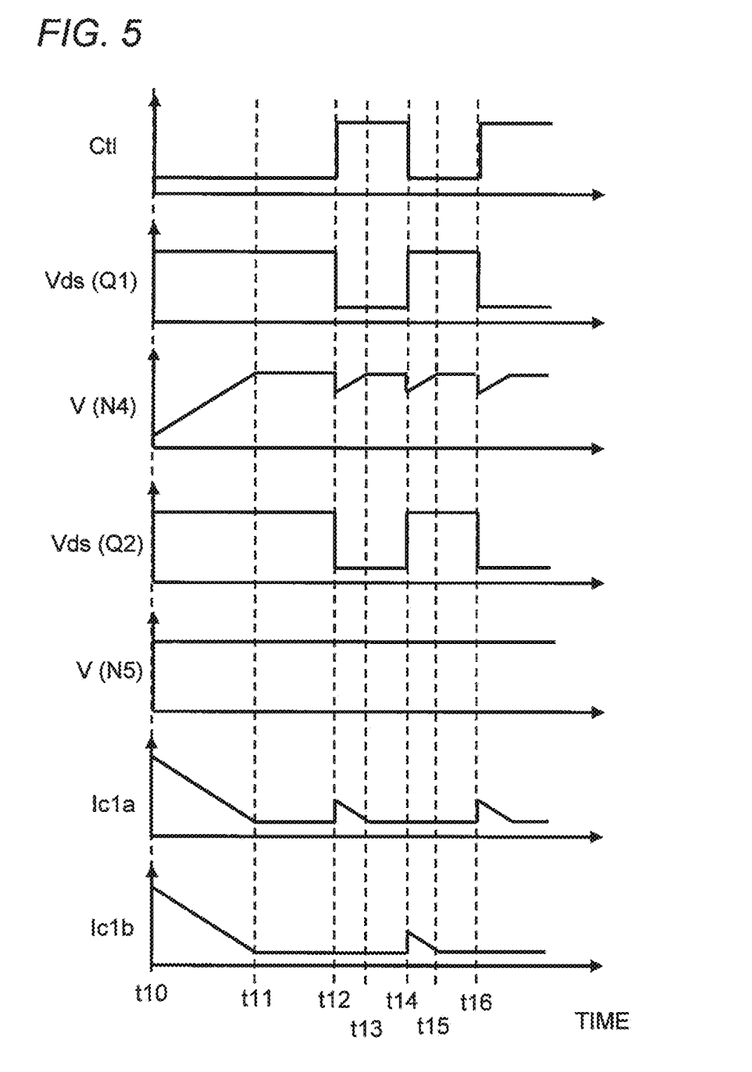
FIG. 5 is a timing chart showing exemplary operation of the switching circuit apparatus 1 of FIG. 1.

FIG. 5 is a timing chart showing exemplary operation of the switching circuit apparatus 1 of FIG. 1. Respective rows of FIG. 5 show the signal level of the control signal Ctl, the gate-source voltages Vgs(Q1) and Vgs(Q2) of the switching elements Q1 and Q2, the voltages V(N4) and V(N5) of the nodes N4 and N5 of FIG. 1, and currents Ic1a and Ic1b flowing from the DC voltage source E1 and the terminal P1 to the capacitor C1.

In the time interval t10 to t12, when the switching elements Q1 and Q2 are turned off (that is, when the control signal Ctl is low), the currents Ic1a and Ic1b flow from the DC voltage source E1 and the terminal P1 to the capacitor C1, respectively, and the voltage V(N4) at the node N4 gradually increases. As a result, before transitioning the switching elements Q1 and Q2 from off to on, the voltage V(N4) at the node N4 reaches high at the time moment t11.

At the time moment t12, when the control signal Ctl transitions from low high, since the voltage potentials of both the nodes N4 and N5 are high, both the switching elements Q1 and Q2 are turned on without delay.

In addition, at the time moment t12, when the switching element Q1 transitions from off to on, a part of the power charged in the capacitor C1 is consumed by the drive circuit DRV1, and the voltage potential V(N4) of the node N4 slightly decreases. The consumed power is charged by the current Id1a flowing from the DC voltage source E1 to the capacitor C1 when the switching elements Q1 and Q2 are turned on. As a result, the voltage V(N4) at the node N4 reaches high again.

Also at the time moment t14, when the switching element Q1 transitions from on to off, a part of the power charged in the capacitor C1 is consumed by the drive circuit DRV1, and the voltage potential V(N4) of the node N4 slightly decreases. The consumed power is charged by the current Ic1b flowing from the terminal P1 to the capacitor C1 when the switching elements Q1 and Q2 are turned off. As a result, the voltage V(N4) at the node N4 reaches high again.

Modified Embodiments of First Embodiment

Figure 6:
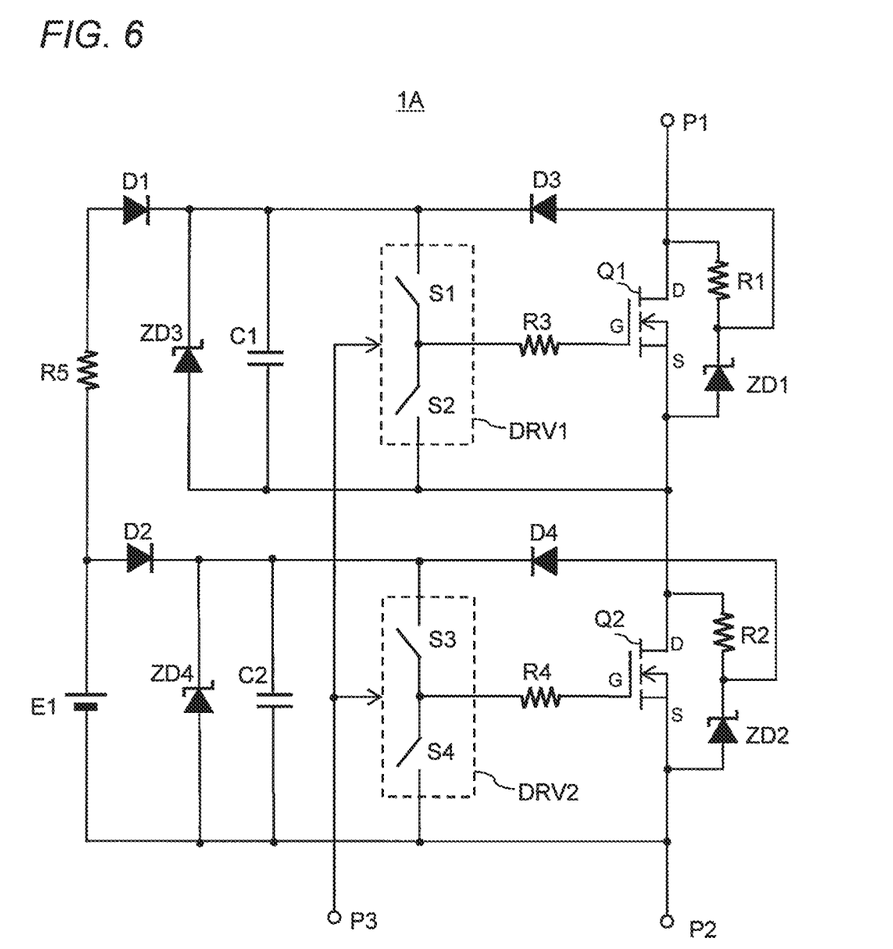
FIG. 6 is a circuit diagram showing an exemplary configuration of a switching circuit apparatus 1A according to a modified embodiment of the first embodiment.

FIG. 6 is a circuit diagram showing an exemplary configuration of a switching circuit apparatus 1A according to a modified embodiment of the first embodiment. The switching circuit apparatus 1A of FIG. 6 is provided with the components of the switching circuit apparatus 1 of FIG. 1, and further provided with Zener diodes ZD3 and ZD4 connected in parallel with the capacitors C1 and C2, respectively. By providing the Zener diodes ZD3 and ZD4, it is possible to stabilize the voltages of the capacitors C1 and C2, that is, the power supply voltages for the drive circuits DRV1 and DRV2.

Advantageous Effects of First Embodiment

Since the switching circuit apparatus 1 according to the first embodiment is provided with the resistor R1, the Zener diode ZD1, and the diode D3, a current flows from the terminal P1 to the capacitor C1 via the resistor R1 and the diode D3 when the switching elements Q1 and Q2 are turned off. Therefore, before turning on the switching elements Q1 and Q2, sufficiently increase the voltage of the capacitor C1 to operate the drive circuit DRV1. As a result, it is possible to simultaneously turn on the switching elements Q1 and Q2 without delay, and an excessive voltage is less likely to be applied to only one of the switching elements. Thus, the switching circuit apparatus 1 according to the present embodiment can control the switching elements Q1 and Q2 to synchronously turn on and off with the bootstrap circuit.

According to the switching circuit apparatus 1 of the first embodiment, the capacitors C1 and C2 can keep appropriate power supply voltages for the drive circuits DRV1 and DRV2.

According to the switching circuit apparatus 1 of the first embodiment, the capacitor C1 can be charged in both the time interval in which the switching elements Q1 and Q2 are turned on, and the time interval in which the switching elements Q1 and Q2 are turned off. Therefore, the capacitors C1 and C2 can keep a sufficiently high voltage to operate the drive circuit DRV1, without depending on the switching frequency and/or duty cycle of the switching elements Q1 and Q2.

According to the switching circuit apparatus 1 of the first embodiment, by controlling the switching elements Q1 and Q2 to synchronously turn on and off, it is possible to reduce the voltage applied to each switching element by half of a case where only one switching element is provided. As a result, it is possible to provide the switching circuit apparatus 1 having withstand voltage performance higher than withstand voltage performance of one switching element. Conversely, it is also possible to relax requirements for the switching element, such as withstand voltage performance. A device with a low withstand voltage has a smaller on-resistance and a lower price, than those of a device with a high withstand voltage. Therefore, by using the switching elements Q1 and Q2 with a low withstand voltage, it is possible to improve the efficiency of the switching circuit apparatus, and reduce the cost, as compared with a case where only one switching element is provided.

Second Embodiment

Hereinafter, a power converter apparatus according to a second embodiment will be described.

Configuration Example of Second Embodiment

Figure 7:
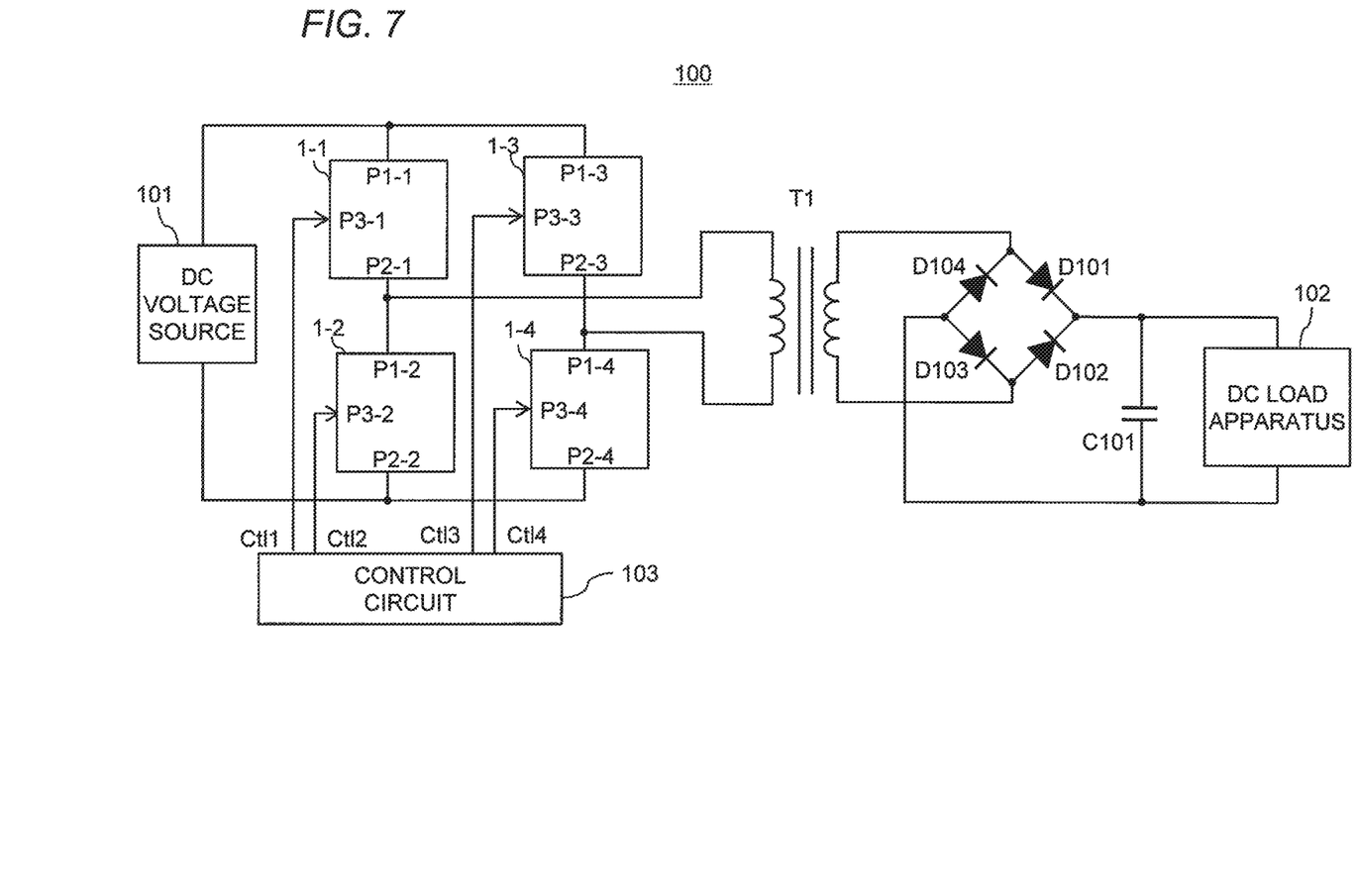
FIG. 7 is a block diagram showing an exemplary configuration of a power converter apparatus 100 according to a second embodiment.

FIG. 7 is a block diagram showing an exemplary configuration of a power converter apparatus 100 according to a second embodiment. The power converter apparatus 100 of FIG. 7 is provided with switching circuit apparatuses 1-1 to 1-4, a DC voltage source 101, a DC load apparatus 102, a control circuit 103, a capacitor C101, diodes D101 to D104, and a transformer T1.

The switching circuit apparatuses 1-1 and 1-2 are connected in series between a positive electrode and a negative electrode of the DC voltage source 101, the switching circuit apparatuses 1-1 and 1-2 being connected via a connection point. In addition, the switching circuit apparatuses 1-3 and 1-4 are connected in series between the positive electrode and the negative electrode of the DC voltage source 101, the switching circuit apparatuses 1-3 and 1-4 being connected via another connection point.

Each of the switching circuit apparatuses 1-1 to 1-4 is configured in a manner similar to that of the switching circuit apparatus 1 of FIG. 1. Terminals P1-1 to P3-1 of FIG. 7 correspond to the terminals P1 to P3 of FIG. 1, respectively. Terminals P1-2 to P3-2 of FIG. 7 also correspond to the terminals P1 to P3 of FIG. 1, respectively; terminals P1-3 to P3-3 of FIG. 7 also correspond to the terminals P1 to P3 of FIG. 1, respectively; and terminals P1-4 to P3-4 of FIG. 7 also correspond to the terminals P1 to P3 of FIG. 1, respectively.

Using control signals Ctl 1 to Ctl4, the control circuit 103 controls the switching circuit apparatuses 1-1 to 1-4 to turn off the switching circuit apparatuses 1-2 and 1-3 when turning on the switching circuit apparatuses 1-1 and 1-4, and to turn off the switching circuit apparatuses 1-1 and 1-4 when the turning on switching circuit apparatuses 1-2 and 1-3. Each of the control signals Ctl 1 to Ctl4 of FIG. 7 corresponds to the control signal Ctl of FIG. 1.

The connection point between the switching circuit apparatuses 1-1 and 1-2, and the connection point between the switching circuit apparatuses 1-3 and 1-4 are connected to a primary winding of the transformer T1.

The diodes D101 to D104 are diode bridges connected to a secondary winding of the transformer T1. The capacitor C101 smooths the voltage outputted from the diode bridge.

The DC load apparatus 102 is any apparatus operable in DC.

The primary circuit of the transformer T1 of FIG. 7 constitutes a full-bridge inverter. In addition, the power converter apparatus 100 of FIG. 7 constitutes an isolated DC/DC converter.

Figure 8:
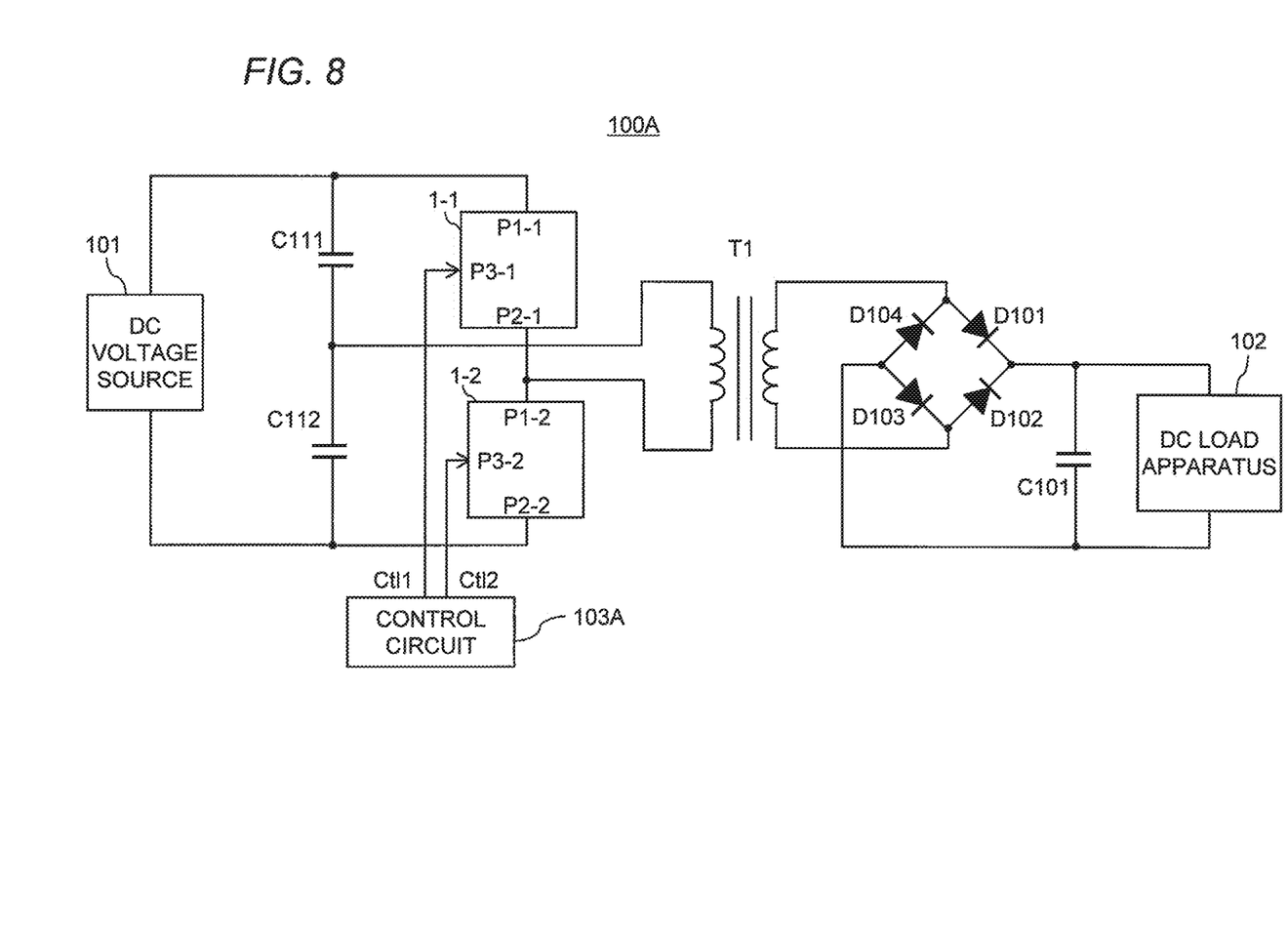
FIG. 8 is a block diagram showing an exemplary configuration of a power converter apparatus 100A according to a first modified embodiment of the second embodiment.

FIG. 8 is a block diagram showing an exemplary configuration of a power converter apparatus 100A according to a first modified embodiment of the second embodiment. The power converter apparatus 100A of FIG. 8 is provided with a control circuit 103A and capacitors C111 and C112, instead of the control circuit 103 and the switching circuit apparatuses 1-3 and 1-4 of FIG. 7.

The capacitors C111 and C112 are connected in series between the positive electrode and the negative electrode of the DC voltage source 101, the capacitors C111 and C112 being connected via a connection point.

Using the control signals Ctl1 and Ctl2, the control circuit 103A controls the switching circuit apparatuses 1-1 and 1-2 to complementarily turn on and off.

The connection point between the switching circuit apparatuses 1-1 and 1-2, and the connection point between the capacitors C101 and C102 are connected to the primary winding of the transformer T1.

In the power converter apparatus 100A of FIG. 8, the secondary circuit of the transformer T1 (the diodes D101 to D104, the capacitor C101, and the DC load apparatus 102) is configured in a manner similar to that of FIG. 7.

The primary circuit of the transformer T1 of FIG. 8 constitutes a half-bridge inverter. In addition, the power converter apparatus 100A of FIG. 8 constitutes an isolated DC/DC converter.

Figure 9:
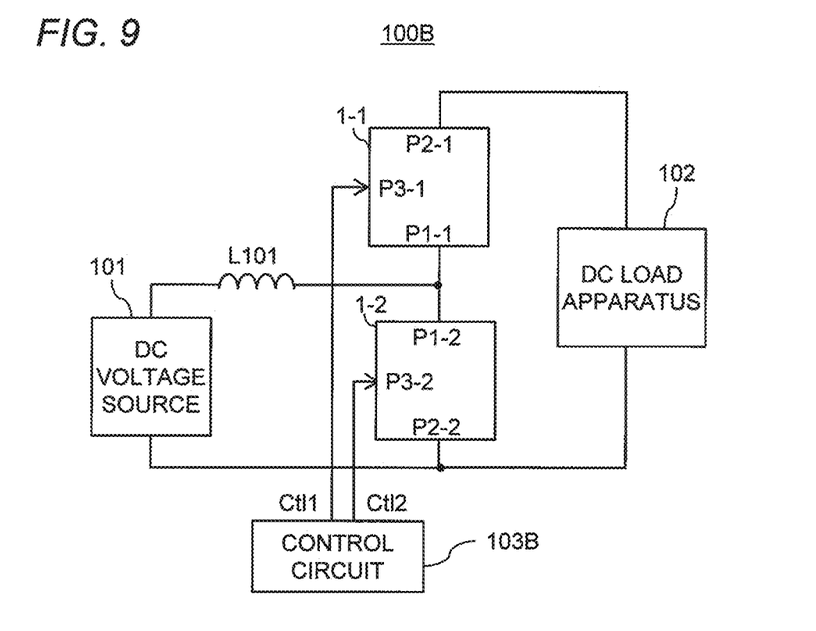
FIG. 9 is a block diagram showing an exemplary configuration of a power converter apparatus 100B according to a second modified embodiment of the second embodiment.

FIG. 9 is a block diagram showing an exemplary configuration of a power converter apparatus 100B according to a second modified embodiment of the second embodiment. The power converter apparatus 100B of FIG. 9 is provided with switching circuit apparatuses 1-1 and 1-2, a DC voltage source 101, a DC load apparatus 102, a control circuit 103B, and an inductor L101.

The switching circuit apparatuses 1-1 and 1-2 are connected in series between a positive electrode and a negative electrode of the DC load apparatus 102, the switching circuit apparatuses 1-1 and 1-2 being connected via a connection point. The connection point between the switching circuit apparatuses 1-1 and 1-2 is connected to the positive electrode of the DC voltage source 101 via the inductor L101.

The negative electrode of the DC voltage source 101 is connected to the negative electrode of the DC load apparatus 102.

Using the control signals Ctl1 and Ctl2, the control circuit 103B controls the switching circuit apparatuses 1-1 and 1-2 to be complementarily turned on and off The power converter apparatus 100B of FIG. 9 constitutes a non-isolated and boost DC/DC converter.

Figure 10:
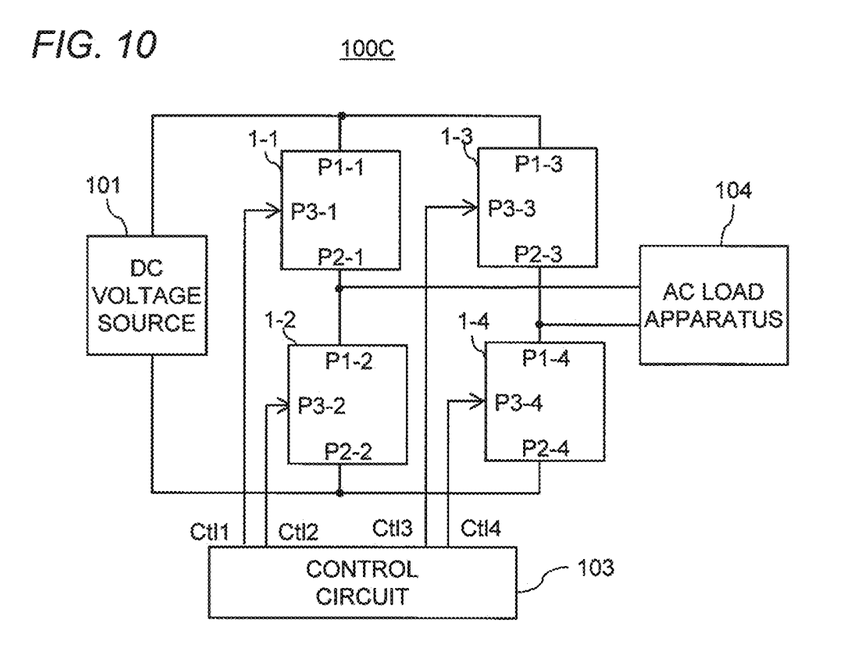
FIG. 10 is a block diagram showing an exemplary configuration of a power converter apparatus 100C according to a third modified embodiment of the second embodiment.

FIG. 10 is a block diagram showing an exemplary configuration of a power converter apparatus 100C according to a third modified embodiment of the second embodiment. The power converter apparatus 100C of FIG. 10 is provided with an AC load apparatus 104, instead of the transformer T1 and the secondary-side circuit of FIG. 7. The power converter apparatus 100C of FIG. 10 constitutes a full-bridge inverter (that is, a DC/AC converter).

Advantageous Effects of Second Embodiment

According to the power converter apparatus of the second embodiment, since the switching circuit apparatuses 1 of FIG. 1 are being provided, it is possible to provide a power converter apparatus having higher withstand voltage performance than that of the prior art, or a power converter apparatus having higher efficiency and lower cost than those of the prior art.

The power converter apparatus according to the second embodiment may be provided with the switching circuit apparatus 1A of FIG. 6, instead of the switching circuit apparatus 1 of FIG. 1.

Modified Embodiments

Although the embodiments of the present disclosure have been described in detail above, the above descriptions are mere examples of the present disclosure in all respects. Needless to say, various improvements and modifications can be made without departing from the scope of the present disclosure. For example, the following changes can be made. Hereinafter, components similar to those of the above embodiments are indicated by similar reference signs, and points similar to those of the above embodiments will be omitted as appropriate. The following modified embodiments can be combined as appropriate.

In the switching circuit apparatus according to the embodiments, each of the capacitors C1 and C2 may be a single capacitor, or may be a plurality of capacitors connected in parallel with each other.

The switching circuit apparatus according to the embodiments may be provided with three or more switching elements connected in series with each other. In this case, the switching circuit apparatus can be configured by, for example, periodically arranging a circuit portion including the switching element Q1, the drive circuit DRV1, the DC voltage source E1, the capacitor C1, the diode D1, the resistors R1 and R3, the Zener diode ZD1, and the diode D3 of FIG. 1.

Summary of Embodiments

The switching circuit apparatus and the power converter apparatus according to the aspects of the present disclosure may be expressed as follows.

A switching circuit apparatus 1 according to an aspect of the present disclosure is connected to first and second DC voltage sources. the switching circuit apparatus 1 is provided with: a first terminal P1, a second terminal P2, first and second switching elements Q1 and Q2, first and second drive circuits DRV1 and DRV2, a first capacitor C1, a second capacitor C2, a first diode D1, a second diode D2, a first series circuit, and a third diode D3. The first terminal P1 is applied with a first voltage from the first DC voltage source. The second terminal P2 is applied with a second voltage lower than the first voltage from the first DC voltage source. The first and second switching elements Q1 and Q2 are connected in series between the first and second terminals P1 and P2, the first and second switching elements Q1 and Q2 being connected via a first node N1. The first and second drive circuits DRV1 and DRV2 control the first and second switching elements Q1 and Q2, respectively, to synchronously turn on and off. The first capacitor C1 is connected to the first node N1, the first capacitor C1 applying a power supply voltage for the first drive circuit DRV1 to the first drive circuit DRV1. The second capacitor C2 is connected to a negative electrode of the second DC voltage source E1 and to the second terminal P2, the second capacitor C2 applying a power supply voltage for the second drive circuit DRV2 to the second drive circuit DRV2. The first diode D1 is connected between a positive electrode of the second DC voltage source E1 and the first capacitor C1 such that a current flows from the second DC voltage source E1 to the first capacitor C1. The second diode D2 is connected between the positive electrode of the second DC voltage source E1 and the second capacitor C2 such that a current flows from the second DC voltage source E1 to the second capacitor C2. The first series circuit includes a first resistor R1 and a first Zener diode ZD1 connected in series between the first terminal P1 and the first node N1, the first resistor R1 and the first Zener diode ZD1 being connected via a second node N2, the first resistor R1 and the first Zener diode ZD1 being connected in parallel with the first switching element Q1, the first series circuit being connected such that a reverse bias voltage is applied from the first terminal P1 to the first Zener diode ZD1 via the first resistor R1. The third diode D3 is connected between the second node N2 and the first capacitor C1 such that a current flows from the second node N2 to the first capacitor C1.

The switching circuit apparatus 1 according to an aspect of the present disclosure is further provided with: a second series circuit and a fourth diode D4. The second series circuit includes a second resistor R2 and a second Zener diode ZD2 connected in series between the first node N1 and the second terminal P2, the second resistor R2 and the second Zener diode ZD2 being connected via a third node N3, the second resistor R2 and the second Zener diode ZD2 being connected in parallel with the second switching element Q2, the second series circuit being connected such that a reverse bias voltage is applied from the first node N1 to the second Zener diode ZD2 via the second resistor R2. The fourth diode D4 is connected between the third node N3 and the second capacitor C2 such that a current flows from the third node N3 to the second capacitor C2.

The switching circuit apparatus 1 according to an aspect of the present disclosure is further provided with: a third resistor R3 connected between the first drive circuit DRV1 and the first switching element Q1; and a fourth resistor R4 connected between the second drive circuit DRV2 and the second switching element Q2.

The switching circuit apparatus 1 according to an aspect of the present disclosure is further provided with: a fifth resistor R5 connected between the positive electrode of the second DC voltage source E1 and the first capacitor C1, the fifth resistor R5 being connected in series with the first diode D1.

The switching circuit apparatus 1 according to an aspect of the present disclosure is further provided with: third and fourth Zener diodes ZD3, ZD4 connected in parallel with the first and second capacitors C1 and C2, respectively.

A power converter apparatus according to an aspect of the present disclosure is provided with: at least one switching circuit apparatus 1 or 1A; and a control circuit 103, 103A configured to control the at least one switching circuit apparatus 1 or 1A.

INDUSTRIAL APPLICABILITY

The switching circuit apparatus according to each aspect of the present disclosure can be applied to, for example, a power converter apparatus, such as a DC/DC converter, but not limited thereto, can be applied to any circuit provided with switching elements.

REFERENCE SIGNS LIST 1, 1-1 to 1-4, 1A: SWITCHING CIRCUIT APPARATUS
100, 100A to 100C: POWER CONVERTER APPARATUS
101: DC VOLTAGE SOURCE
102: DC LOAD APPARATUS
103, 103A, 103B: CONTROL CIRCUIT
104: AC LOAD APPARATUS
C1 to C2, C101, C111 to C112: CAPACITOR
D1 to D4, D101 to D104: DIODE
DRV1 to DRV2: DRIVE CIRCUIT
E1: DC VOLTAGE SOURCE
P1 to P3: TERMINAL
Q1 to Q2: SWITCHING ELEMENT
R1 to R5: RESISTOR
T1: TRANSFORMER
ZD1 to ZD4: ZENER DIODE

The invention claimed is:

1. A switching circuit apparatus connected to first and second DC voltage sources, the switching circuit apparatus comprising:
a first terminal to which a first voltage is applied from the first DC voltage source;
a second terminal to which a second voltage lower than the first voltage is applied from the first DC voltage source;
first and second switching elements connected in series between the first and second terminals, the first and second switching elements being connected via a first node;
first and second drive circuits configured to control the first and second switching elements, respectively, to synchronously turn on and off;
a first capacitor connected to the first node, the first capacitor applying a power supply voltage for the first drive circuit to the first drive circuit;
a second capacitor connected to a negative electrode of the second DC voltage source and to the second terminal, the second capacitor applying a power supply voltage for the second drive circuit to the second drive circuit;
a first diode connected between a positive electrode of the second DC voltage source and the first capacitor such that a current flows from the second DC voltage source to the first capacitor;
a second diode connected between the positive electrode of the second DC voltage source and the second capacitor such that a current flows from the second DC voltage source to the second capacitor;
a first series circuit including a first resistor and a first Zener diode connected in series between the first terminal and the first node, the first resistor and the first Zener diode being connected via a second node, the first resistor and the first Zener diode being connected in parallel with the first switching element, the first series circuit being connected such that a reverse bias voltage is applied from the first terminal to the first Zener diode via the first resistor; and a third diode connected between the second node and the first capacitor such that a current flows from the second node to the first capacitor.

2. The switching circuit apparatus as claimed in claim 1, further comprising:

a second series circuit including a second resistor and a second Zener diode connected in series between the first node and the second terminal, the second resistor and the second Zener diode being connected via a third node, the second resistor and the second Zener diode being connected in parallel with the second switching element, the second series circuit being connected such that a reverse bias voltage is applied from the first node to the second Zener diode via the second resistor; and a fourth diode connected between the third node and the second capacitor such that a current flows from the third node to the second capacitor.

3. The switching circuit apparatus as claimed in claim 1, further comprising:

a third resistor connected between the first drive circuit and the first switching element; and a fourth resistor connected between the second drive circuit and the second switching element.

4. The switching circuit apparatus as claimed in claim 1, further comprising a fifth resistor connected between the positive electrode of the second DC voltage source and the first capacitor; the fifth resistor being connected in series with the first diode.

5. The switching circuit apparatus as claimed in claim 1, further comprising third and fourth Zener diodes connected in parallel with the first and second capacitors, respectively.

6. A power converter apparatus comprising:

at least one switching circuit apparatus; and a control circuit configured to control the at least one switching circuit apparatus, wherein the switching circuit apparatus is connected to first and second DC voltage sources, the switching circuit apparatus comprising:

a first terminal to which a first voltage is applied from the first DC voltage source;

a second terminal to which a second voltage lower than the first voltage is applied from the first DC voltage source;

first and second switching elements connected in series between the first and second terminals, the first and second switching elements being connected via a first node;

first and second drive circuits configured to control the first and second switching elements, respectively, to synchronously turn on and off;

a first capacitor connected to the first node, the first capacitor applying a power supply voltage for the first drive circuit to the first drive circuit;

a second capacitor connected to a negative electrode of the second DC voltage source and to the second terminal, the second capacitor applying a power supply voltage for the second drive circuit to the second drive circuit;

a first diode connected between a positive electrode of the second DC voltage source and the first capacitor such that a current flows from the second DC voltage source to the first capacitor;

a second diode connected between the positive electrode of the second DC voltage source and the second capacitor such that a current flows from the second DC voltage source to the second capacitor;

a first series circuit including a first resistor and a first Zener diode connected in series between the first terminal and the first node, the first resistor and the first Zener diode being connected via a second node, the first resistor and the first Zener diode being connected in parallel with the first switching element, the first series circuit being connected such that a reverse bias voltage is applied from the first terminal to the first Zener diode via the first resistor; and a third diode connected between the second node and the first capacitor such that a current flows from the second node to the first capacitor.

* * * * *